United States Patent [19]
Yoshida et al.

[11] Patent Number: 5,610,525
[45] Date of Patent: Mar. 11, 1997

[54] BATTERY CAPACITY DETECTOR

[75] Inventors: Toshio Yoshida; Yukihiro Kanno, both of Tokyo, Japan

[73] Assignee: NEC Corporation, Tokyo, Japan

[21] Appl. No.: 381,236

[22] Filed: Jan. 31, 1995

[30] Foreign Application Priority Data

Jan. 31, 1994 [JP] Japan .................................... 6-027485

[51] Int. Cl.$^6$ ......................... G01N 27/416; G01R 31/36
[52] U.S. Cl. ......................... 324/433; 324/427; 340/636
[58] Field of Search ................................. 324/426, 427, 324/429, 433; 340/636; 320/48; 455/38.3, 343

[56] References Cited

U.S. PATENT DOCUMENTS

| 4,849,700 | 7/1989 | Morioka et al. | 324/427 |
| 5,111,148 | 5/1992 | Senoo et al. | 324/433 |
| 5,122,751 | 6/1992 | Aita et al. | 324/429 |

FOREIGN PATENT DOCUMENTS

| 0416589 | 3/1991 | European Pat. Off. . |
| 0423918 | 4/1991 | European Pat. Off. . |
| 0512711 | 11/1992 | European Pat. Off. . |
| 2511681 | 9/1976 | Germany . |

Primary Examiner—Kenneth A. Wieder
Assistant Examiner—Glenn W. Brown
Attorney, Agent, or Firm—Sughrue, Mion, Zinn, Macpeak & Seas

[57] ABSTRACT

In communication equipment which uses a battery as the power supply, when a controller increases the transmission power at a transmitter corresponding to a drop in the electric field intensity, the controller lowers, accompanying that operation, a reference voltage from a reference voltage source which is used for comparison with the battery voltage for the purpose of detecting a drop in the battery capacity. Therefore, even when the battery voltage is dropped due to an increase in the transmission output, the reference voltage is also lowered correspondingly, so that there will not occur an erroneous detection of drop in the battery capacity due to the drop in the battery voltage.

9 Claims, 4 Drawing Sheets

BATTERY CAPACITY DETECTOR

BACKGROUND OF THE INVENTION

1. Field of the Invention

The present invention relates to a battery capacity detector, and more particularly to a device for accurately detecting a capacity drop in the power supply batteries used for communication equipment.

2. Description of the Related Art

In a portable equipment for mobile communication such as a portable telephone, batteries are generally used for its power supply. Therefore, the normal operation of the equipment cannot be secured if the battery power is deteriorated. For that reason, there have been proposed devices which urge the user to replace or recharge the batteries by issuing an alarm when the battery voltage (or battery power) drops below a specified voltage level.

A cordless telephone system having such an alarm function is disclosed in, for example, Japanese Patent Laid-Open Application No. 354230/1992 (JP-A-H04-354230). This cordless telephone system includes a master set and a slave set which is carried for use. In the slave set, a battery capacity detector detects the voltage of the batteries which supply power to a communication component of the system which includes a radio portion, a modem, a control portion, and the like. When the detected battery voltage drops to below a predetermined value, the control portion displays in a display portion of the system a signal that indicates a drop in the remaining capacity, and notifies the information to the master set via the communication component. Upon receipt of this signal the master set issues an alarm.

Now, a radio data transmitter, such as a teleterminal, has a function of controlling the voltage of transmission signals in response to communication circumstances. For example, the radio data transmitter has a function of monitoring the electric field intensity of a received radio signal. When the electric field intensity lowers, the transmission voltage is increased successively in accordance with the electric field intensity in order to perform all the time a suitable data transmission corresponding to the electric field intensity. However, when the detector for detecting a drop in the battery voltage, as described above, is installed in the radio data transmitter, the load in the circuit supplied with the power is increased with the increase in the transmission power, causing a drop in the battery voltage. Because of this, in a type of device which detects the battery capacity based on the battery voltage, a drop in the battery voltage is detected when the transmission power is increased, and an alarm is issued sometimes in spite of the fact that a sufficient battery capacity remains.

Similarly, if one attempts to equip the abovementioned cordless telephone system with a function which, for example, controls the transmission power in response to the electric field intensity of the received signal, the battery voltage is dropped temporarily due to the increase in the transmission power. Therefore, the system judges the situation as a drop in the battery capacity, which results in a problem of erroneous display or alarm issuance.

Furthermore, when the battery voltage drops temporarily due not only to a change in the transmission power, but also to a variation in the battery load during communication, a similar erroneous detection of the battery capacity may happen.

SUMMARY OF THE INVENTION

It is therefore an object of this invention to provide a battery capacity detector capable of detecting a drop in battery capacity more accurately irrespective of variations in the battery load.

Another object of this invention is to provide a battery capacity detector capable of detecting accurately a drop in battery capacity irrespective of the changes in the transmission power of a transmitter.

In a communication device, it is desirable to have a function of detecting the battery capacity based on the battery voltage, and of urging the user to replace or recharge the battery when the battery voltage drops to below a voltage where the communication device begins to fail to perform its normal operation. Therefore, it is desirable to designate a voltage value at which the communication device no longer performs its normal operation as the reference value, and compare the detected battery voltage with this reference value.

However, the battery voltage drops temporarily due to changes in the communication circumstances, for example, an increase in the transmission power or the battery load. Therefore, the comparison of the battery voltage with the reference value results in the indication of a drop of the battery voltage to below the reference value, giving rise to the notification of this information to the user.

In view of such problems, the battery capacity detector according to the present invention includes a detector which detects the battery voltage, a comparator which compares a detected battery voltage with a predetermined reference, and a controller which varies the predetermined reference value in response to a battery load.

In communication equipment in which the transmission power is controlled according to communication circumstances, it is preferable to provide the communication equipment with a means for detecting the transmission power and a means for varying the reference voltage value in response to the detected transmission power.

For example, a change in the transmission power may be detected by a change in the electric field intensity of the received signal. Or, the transmission power may be controlled based on the AGC signal in the receiving system of the communication equipment.

According to this invention, when the battery voltage drops due to an increase in the battery load, the reference voltage is arranged to drop also in response to the drop in the battery voltage, so that an erroneous detection of the battery capacity drop will not occur.

Moreover, even when the battery voltage drops due to an increase in the transmission power at the time the electric field intensity of the received signal drops, the drop in the battery voltage is arranged not to be detected as a voltage drop. This is accomplished, in part, by lowering the reference voltage accompanying the increase in the transmission power. Therefore, the erroneous detection of the battery capacity drop can be prevented.

BRIEF DESCRIPTION OF THE DRAWINGS

The above and other objects, features and advantages of this invention will become more apparent from the following detailed description taken with the accompanying drawings in which.

In the drawings, the same reference numerals denote the same structural elements.

DESCRIPTION OF THE PREFERRED EMBODIMENTS

Figure 1:
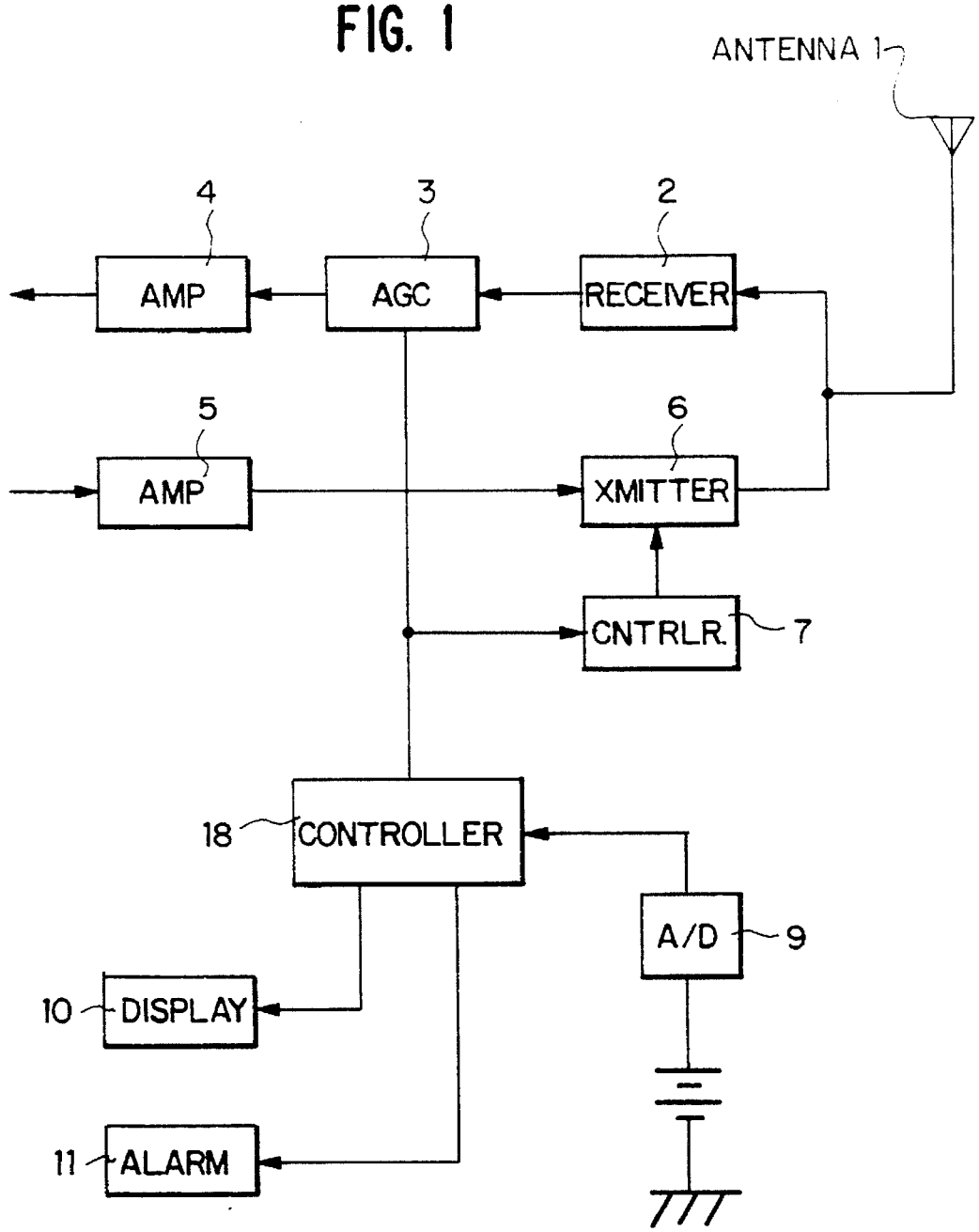
FIG. 1 is a block diagram of a communication device which is a preferred embodiment of a battery capacity detector according to the present invention.

FIG. 1 is a block diagram of a communication device, preferably a portable telephone, which has a first preferred embodiment of a battery capacity detector according to the present invention.

During reception, a receiver 2 converts a radio signal received by an antenna 1 to a received intermediate frequency (IF) signal. An automatic gain controller (AGC) 3 controls the level of the received IF signal to a predetermined level and supplies a level-controlled IF signal to an amplifier 4. The amplifier 4 amplifies the level-controlled IF signal to obtain an amplified received IF signal, and outputs the amplified received IF signal to an IF portion of the device (not shown). On the other hand, during transmission, an amplifier 5 amplifies a transmitting IF signal which is input from the IF portion. A transmitter 6 transmits a transmitting radio frequency (RF) signal obtained by converting an amplified transmitting IF signal, via the antenna 1. The transmitter 6 has the function of varying the transmission power of the transmitting RF signal. A controller 7 is supplied from the AGC 3 with an AGC signal which is closely related to the electric field of the received signal, and outputs a transmission power control signal which varies the transmission power at the transmitter 6.

A battery 8 is a power supply for driving the various parts within the telephone set. The voltage of the battery 8 is converted in an A/D converter 9 to a digital signal that corresponds to the voltage. This digital signal is input to a controller 18. The controller 18 compares the input battery voltage with a reference voltage. When the battery voltage dropped to below the reference voltage, the controller 18 causes a battery capacity display 10 to display the drop of the battery capacity, or an alarm 11 to issue an alarm. As will be described later, the reference voltage is made variable corresponding to the level of the AGC signal.

Figure 2:
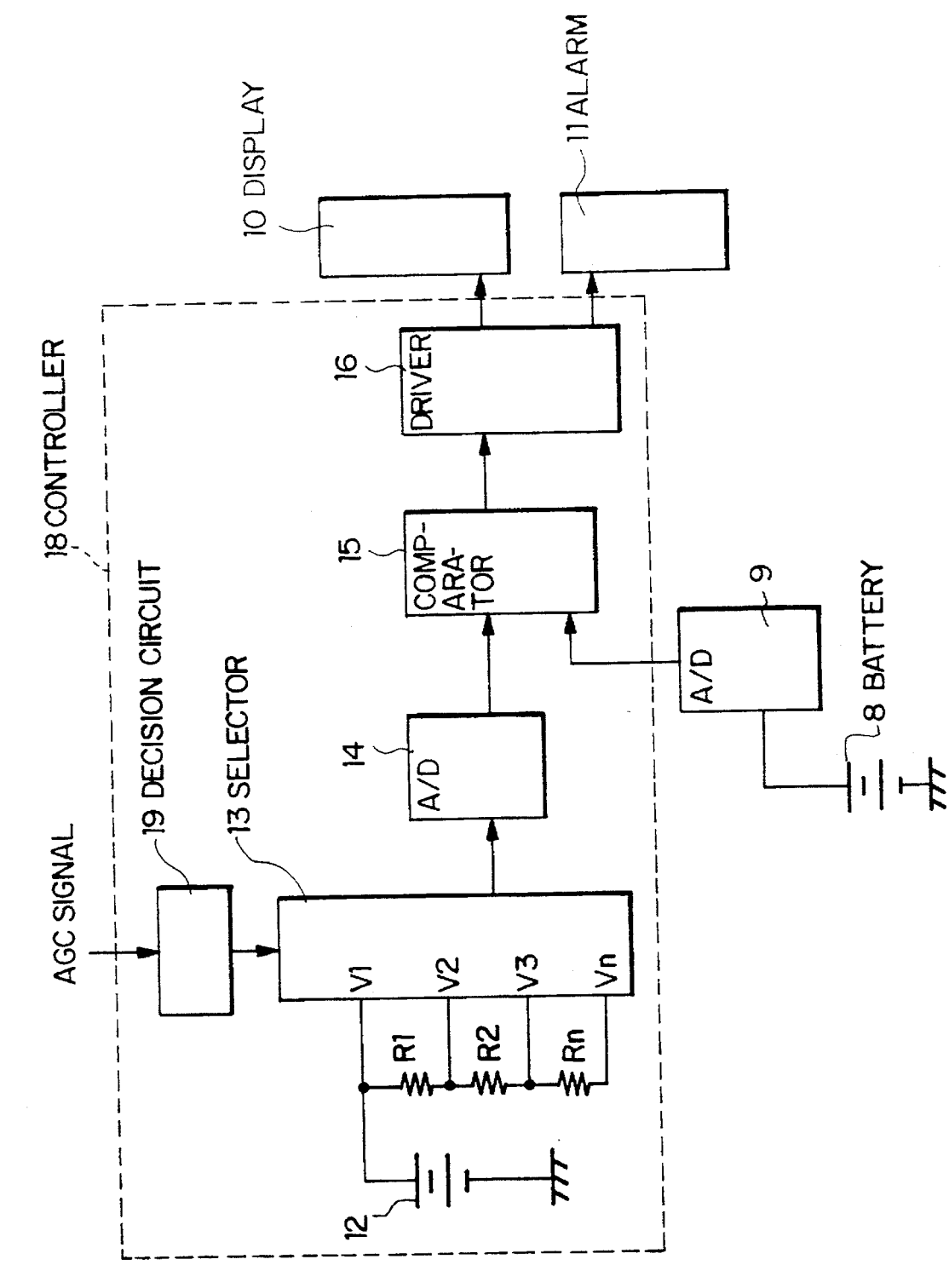
FIG. 2 is a block diagram of a preferred embodiment of the controller shown in FIG. 1.

FIG. 2 is a block diagram of a preferred embodiment of the controller 18 shown in FIG. 1.

A reference voltage source 12 is connected in series with a plurality of resistors Rl to Rn. A plurality of voltages Vl to Vn obtained by dividing the reference voltage are taken out from the junctions of the resistors Rl to Rn, and the plurality of voltages Vl to Vn are input to a selector 13. A decision circuit 19 inputs an AGC signal from the AGC 3, and outputs a select signal which selects one out of the plurality of voltages in response to the level of the AGC signal. The selector 13 selects one out of the plurality of different voltages Vl to Vn in response to the select signal as described later. One of the voltages selected by the selector 13 is converted to a digital signal in an A/D converter 14, and is supplied to one of the input nodes of a comparator 15. To the other input node of the comparator 15 is input the output of the A/D converter 9 connected to the battery 8. The comparison output of the comparator 15 is supplied to a driving circuit 16 which drives the battery capacity display 10 and the alarm 11.

In the portable telephone shown in FIG. 1, when the communication state is deteriorated by, for example, the drop of the electric field intensity of the received signal, the reception level at the receiver 2 goes down, so that the level of the AGC signal from the AGC 3 goes up. Therefore, upon receipt of the AGC signal, the controller 7 sends the transmission power control signal to the transmitter 6 to execute the control of the increase in the transmission power of the transmitting RF signal from the transmitter 6. Then, the load of the battery 8 is raised due to the increase in the transmission power, and the voltage of the battery 8 goes down.

On the other hand, in the controller 18, the selector 13 selects one of the plurality of divided voltages Vl to Vn of the reference voltage source 12 based on the level of the AGC signal. In other words, the selection is carried out, based on the electric field intensity, or on the transmission power which is closely related to the electric field intensity. Preferably, a voltage, which is roughly inversely proportional to the transmission power, is selected in the selector 13 and is output as a reference voltage. The selected reference voltage, i.e., one of the divided voltages, is input to the comparator 15 after being converted to the digital signal by the A/D converter 14. This signal is compared in the comparator 15 with the voltage of the battery 8 which is converted to a digital signal by the A/D converter 9. As a result, if the voltage of the battery 8 is found to be lower than the selected reference voltage, a driving signal which drives the battery capacity display 10 and the alarm 11 is supplied to the driving circuit 16 to display and issue an alarm that the battery capacity has dropped.

Since, the battery load is raised accompanying the increase in the transmission power, the voltage of the battery 8 goes down temporarily. However, at the same time, a voltage power less than the original reference voltage is also selected as the selected reference voltage, as a result of the increase in the transmission power. Therefore, even when the battery voltage drops due to the increase in the transmission power, the battery voltage in the comparator 15 does not go to a level below the selected reference voltage. Thus, erroneous detection of the drop in the battery capacity is avoided.

Moreover, the selector 13 selects a voltage which corresponds to the extent of increase in the transmission power as the selected reference voltage so that it is possible to vary the reference voltage by following the change in the transmission power. Therefore, a temporary drop in the battery voltage will not be judged as a drop in the battery capacity, and it is possible to accurately detect the battery capacity and issue a correct alarm all the time.

Figure 3:
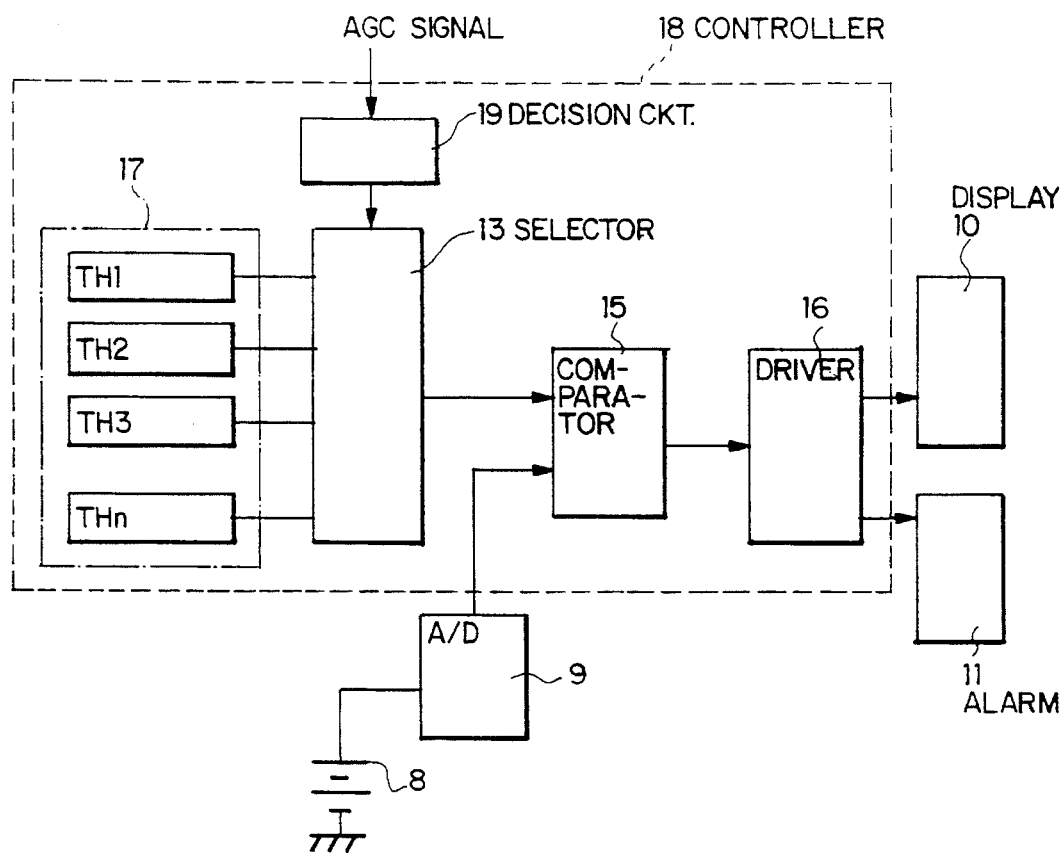
FIG. 3 is a block diagram of another preferred embodiment of the controller shown in FIG. 1.

FIG. 3 is a block diagram of another embodiment of the controller 18. In FIG. 3, a plurality of values THl to THn of the reference voltage corresponding to a plurality of different transmission powers are stored in advance in a memory 17. Either one of these stored reference values THl to THn is selected based on the level of the AGC signal in the selector 13, and supplied to one of the input nodes of the comparator 15. The value of the digital signal obtained in a manner similar to the above embodiment by converting the voltage of the battery 8 with the A/D converter 9 is supplied to the other input node of the comparator 15.

Therefore, also in this embodiment, the controller 7 recognizes the electric field intensity based on the AGC signal, and accordingly controls the transmission power. At the same time, the selector 13 in the controller 18 reads from the memory one of the reference values corresponding to the transmission power based on the AGC signal, and uses the selected reference voltage as the reference voltage in the comparator 15. Consequently, even when the battery voltage drops temporarily due to an increase in the transmission power, the reference voltage value is reduced simultaneous with the drop, so that erroneous detection of this state as a drop in the battery capacity and an erroneous issuance of alarm will not take place.

In the first embodiment of the controller 18, the reference voltage is selected by the selector in a stepwise manner. However, a constitution may be adopted by which a continuously varying reference Voltage is output, and supplied to the comparator. For example, the plurality of resistors R1 to Rn may be replaced by a variable resistor, and may control the resistance of the variable resistor in response to the select signal which is based on the AGC signal.

Moreover, in the above embodiments, the transmission power is controlled in response to the electric field intensity, so that the reference voltage if varied by utilizing the AGC signal which is closely related to the transmission power. However, the transmission power maybe controlled by some other factor. For example, in a device whose transmission power is controlled based on the error rate or the like, the system may be constituted so as to change and control the reference voltage by directly utilizing the transmission power information.

Figure 4:
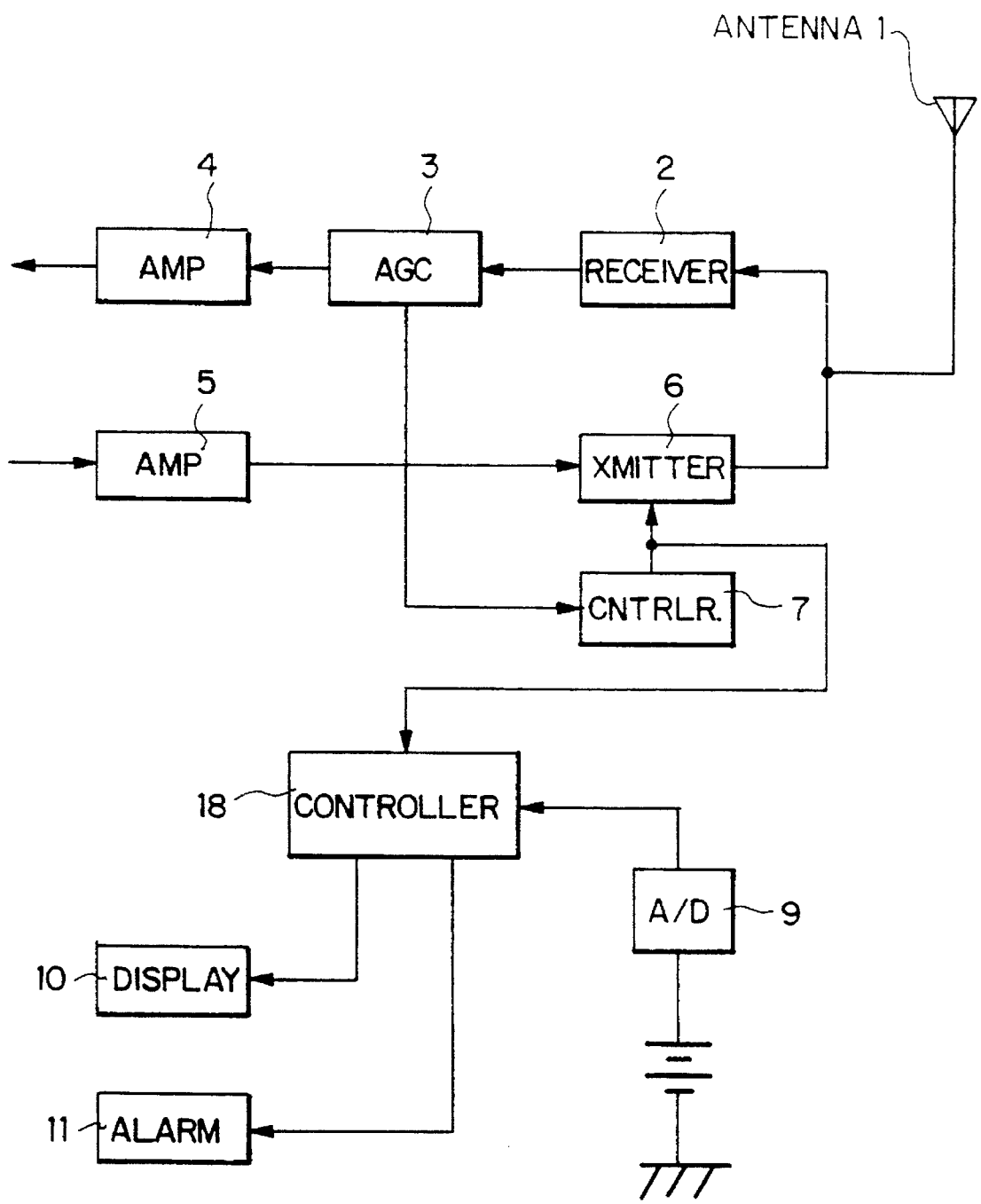
FIG. 4 is a block diagram of another embodiment of the present invention.

For example, as shown in FIG. 4, the reference voltage may be controlled based on a transmission power control signal from the controller 7. In that case, the transmission power control signal instead of the AGC signal is supplied to the decision circuit 19 shown in FIG. 2 or 3. Since the remaining configuration and operation of the device shown in FIG. 4 are the same as those of the device shown in FIG. 1, a further description will be omitted. Here, the controller 7 controls the transmitter 6 in response to the AGC signal, but the controller 7 may independently control the transmitter 6 without responding to the AGC signal.

Furthermore, when the battery load is varied by some other factor regardless of the transmission power, this invention may be provided with a detector for detecting the load, and the device may be constructed so as to vary and control the reference voltage in response to the extent of the load.

Figure 5:
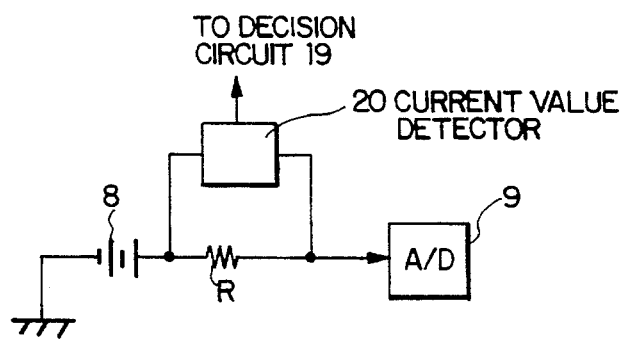
FIG. 5 is a block diagram of yet another embodiment of the present invention.

For example, as shown in FIG. 5, a resistor R is inserted between the battery 8 and the A/D converter 9, and the current flowing in the resistor R is detected by an ammeter 20, a current value detector, or the like. The detected current value is supplied to the decision circuit 19 shown in FIG. 2 or 3. The decision circuit 19 stores in advance several threshold values, and the detected current value is compared with these threshold values. According to the result of the comparison, the decision circuit 19 sends a select signal to the selector 13 indicating to select an adequate reference voltage.

As in the above, by varying the reference voltage in response to the load on the battery, in a receiver having the battery saving function, it is possible to prevent an erroneous battery capacity detection.

As described in the above, according to the present invention, in detecting the battery capacity by comparing the voltage of the battery used as a power supply with a reference voltage, the reference voltage with which the detected battery voltage is compared is made to vary in response to the battery load. Since the communication device is so arranged as to lower the reference voltage in response to a drop in the battery voltage caused by an increase in the battery load, the comparison of these voltages will not lead to the judgment of a drop in the battery capacity, and hence an erroneous detection of the battery capacity can be prevented.

In addition, in a communication equipment whose transmission power is varied and controlled in response to communication circumstances, according to the present invention in which the reference voltage is varied in response to the transmission power, even when the battery voltage is dropped due to an increase in the transmission power, the reference voltage is lowered accompanying the increase in the transmission power. Therefore, a detection result indicating that the battery capacity is dropped will not be output, and an erroneous detection of the drop in the battery capacity can be prevented.

In this way, erroneous detection of the battery capacity due to variations in the load, operating conditions, or the like can be avoided, so that an accurate determination as to the remaining capacity of the battery can be made possible. Thus, the accurate issuance of the battery alarm can be ensured.

While the invention has been described with reference to specific embodiments thereof, it will be appreciated by those skilled in the art that numerous variations, modifications, and embodiments are possible, and accordingly, all such variations, modifications, and embodiments are to be regarded as being within the spirit and scope of the invention.

What is claimed is:

1. A communication device comprising:

power supply means;

detection means for detecting a supply voltage of said power supply means;

comparison means for comparing said supply voltage with a reference value;

varying means for varying said reference value in response to a load on said power supply means;

transmission means for transmitting a reference signal; and first control means for controlling an output level of said reference signal;

wherein said varying means utilizes the output level of said transmitting signal as said load on said power supply means.

2. The communication device as claimed in claim 1, further comprising:

reception means for receiving a receiving signals; and a second control means for controlling a level of said receiving signal and for supplying a control signal to said first control means.

3. The communication device as claimed in claim 2, further comprising:

informing means; and driving means for driving said informing means when said power supply voltage is lower than said reference value.

4. The communication device as claimed in claim 2, wherein said second control means comprises an automatic gain controller.

5. A communication device comprising:

power supply means;

detection means for detecting a supply voltage of said power supply means;

comparison means for comparing said supply voltage with a reference value;

varying means for varying said reference value in response to a load on said power supply means;

transmission means for transmitting a reference signal;

first control means for controlling an output level of said reference signal;

reception means for receiving a receiving signal; and a second control means for controlling a level of said receiving signal and for supplying a control signal to said first control means;

wherein said varying means utilizes said control signal as the load on said power supply.

6. A method for controlling a detection of a remaining capacity of a battery, the method comprising the steps of:

detecting a battery voltage of the battery;

varying a reference value in response to a load on said battery;

comparing said battery voltage with said reference value;

transmitting a transmitting signal; and controlling an output level of the transmitting signal;

wherein, in said step of varying, the output level of the transmitting signal is used as said load on the battery.

7. The method as claimed in claim 6, the method further comprising the step of:

informing a user about status when said battery voltage is lower than said selected reference value.

8. A method for controlling a detection of a capacity of a battery, the method comprising the steps of:

detecting a battery voltage of said battery;

supplying a plurality of reference values;

selecting one of said plurality of reference values in response to a load on said battery;

supplying a selected reference value;

comparing said battery voltage with said selected reference value;

transmitting a transmitting signal; and controlling an output level of the transmitting signal;

wherein, in said step of selecting, the output level of the transmitting signal is used as said load on the battery.

9. The method as claimed in claim 8, wherein said selecting step selects said one of said plurality of reference values based on a load on said battery.

* * * * *